United States Patent [19]
Gal

[11] Patent Number: 5,901,896
[45] Date of Patent: May 11, 1999

[54] BALANCED LOW MASS MINIATURE WIRE CLAMP

[75] Inventor: Yoram Gal, Kibbutz Yagur, Israel

[73] Assignee: Kulicke and Soffa Investments, Inc, Wilmington, Del.

[21] Appl. No.: 08/883,319

[22] Filed: Jun. 26, 1997

[51] Int. Cl.⁶ .................................................. H01L 21/60
[52] U.S. Cl. ...................... 228/4.5; 228/44.7; 228/180.5; 310/323
[58] Field of Search ........................... 228/4.5, 1.1, 44.7, 228/212, 180.5; 310/323, 328; 269/224

[56] References Cited

U.S. PATENT DOCUMENTS

| | | | |
|---|---|---|---|
| 3,672,556 | 6/1972 | Diepeveen | 228/47 |
| 4,653,681 | 3/1987 | Dreibelbis et al. | 228/4.5 |
| 5,277,355 | 1/1994 | Weaver et al. | 228/4.5 |
| 5,314,175 | 5/1994 | Izumi et al. | 269/224 |
| 5,323,948 | 6/1994 | Yamazaki et al. | 228/4.5 |
| 5,388,751 | 2/1995 | Harada et al. | 228/4.5 |
| 5,435,477 | 7/1995 | Torihata et al. | 228/4.5 |
| 5,746,422 | 5/1998 | Harada et al. | 269/172 |

*Primary Examiner*—Patrick Ryan
*Assistant Examiner*—Kiley Stoner
*Attorney, Agent, or Firm*—John B. Sowell

[57] ABSTRACT

An ultra low mass wire clamp for operating at a very high speed where acceleration and deceleration forces exceeding thirty times the forces of gravity includes a wire clamp body portion having a machined recess therein for mounting a first fixed jaw in an exact reference position. A cantilever arm connected to and extending from the body portion has a second machine recess therein for receiving and mounting a second movable jaw in an exact position juxtaposed the fixed jaw so that the faces of the jaws are in exact parallel when mounted in their respective recesses. There is further provided an adjustment screw which engages the movable jaw or the movable actuator so as to adjust the fail safe zero voltage clamping force between jaws which is designed to maintain a clamping force on a wire under power failure conditions.

18 Claims, 6 Drawing Sheets

BALANCED LOW MASS MINIATURE WIRE CLAMP

BACKGROUND OF THE INVENTION

1. Field of the Invention

The present invention relates to wire clamps of the type used on semiconductor wire bonding machines. More particularly, the present invention relates to balanced low mass wire clamps that will withstand very high gravitational forces without a change in clamping forces.

2. Description of the Prior Art

Wire clamps for wire bonders are classified in U.S. Class 228, subclass 4.5 and in International Class B23K subclasses 37/00 and 31/02. It is known by wire clamp designers that wire clamps must be capable of moving from an open to a closed position and vice versa rapidly on command. Some bonding machines are capable of making up to ten wire interconnections per second. Each bonded wire requires opening and closing the wire clamp at least four times or forty position changes per second. This rapid movement requires rapid acceleration and deceleration of moving parts to effect the desired change of position of the jaws of the wire clamps and desired clamping forces.

In a closed position the jaws of the wire clamp must exert a low predetermined clamping force designed to hold a gold wire without causing deformation. The gravitation forces exerted on the parts of a wire clamp often exceed 30 g's. Every pivotable and moveable part has a center of gravity representative of the center of mass of the movable part which is accelerating and decelerating at 30 g's (32.4 feet per second$^2$). This acceleration is translated into forces applied to the jaws of the wire clamp. Heretofore, wire clamp for wire bonders were designed to generate symmetrical counter-balanced forces to prevent the acceleration and deceleration forces from generating harmful forces at the jaws of a wire clamp. Examples of such balanced force wire clamp are shown and described in U.S. Pat. Nos. 4,653,681 and 5,277,355, assigned to the same assignee as the present invention, and are incorporated by reference herein.

It is also known that the unbalanced forces of acceleration and deceleration may be reduced by reducing the size and mass of the moving parts in a wire clamp. Thus, the elements which comprise the parts of a wire clamp can be reduced to further reduce unwanted forces at the wire clamp jaws.

It would be desirable to provide a universal wire clamp assembly that embodies low mass pivotable levers with a low mass actuator that can be symmetrically balanced against undesirable inertia forces.

SUMMARY OF INVENTION

It is a primary object of the present invention to provide a new and improved low mass balanced wire clamp.

It is a primary object of the present invention to provide a low mass wire clamp which operates in a fail safe mode to prevent wire loss during power interruption or power loss.

It is another primary object of the present invention to provide a novel bimorph actuating arm which is detachably mounted on the body of a wire clamp and includes a device for easily adjusting the gap between jaws and/or rapidly replacing jaws.

It is another object of the present invention to provide a wire clamp which may be operated in a power on normally open or a normally closed mode of operation and still provides fail safe operation.

It is another object of the present invention to increase the speed of opening or closing the clamping jaws in a wire clamping operation to under one millisecond and/or very close to the bimorph response time It is another object of the present invention to provide an electrically insulated and isolated bimorph actuator for a wire clamp.

It is another general object of the present invention to provide a universal miniature low mass wire clamp that can be adapted for use on numerous different wire bonders including retrofitting thousands of existing wire bonders to improve their operation.

According to these and other objects of the present invention there is provided a wire clamp body for mounting on a wire bonding head for movement with a bonding tool transducer. The wire clamp body comprises a fixed arm and an actuating arm mounted on the wire clamp body. A first fixed jaw is mounted in the wire clamp body and a second jaw is supported on a cantilevered arm juxtaposed the first jaw mounted on the fixed arm. The cantilevered arm has a gap adjusting screw coupled thereto for adjusting the gap between jaws and for clamping a wire therebetween during power outages and with a predetermined adjustable force during clamping operations.

DETAILED DESCRIPTION OF THE PREFERRED EMBODIMENTS

Figure 1:
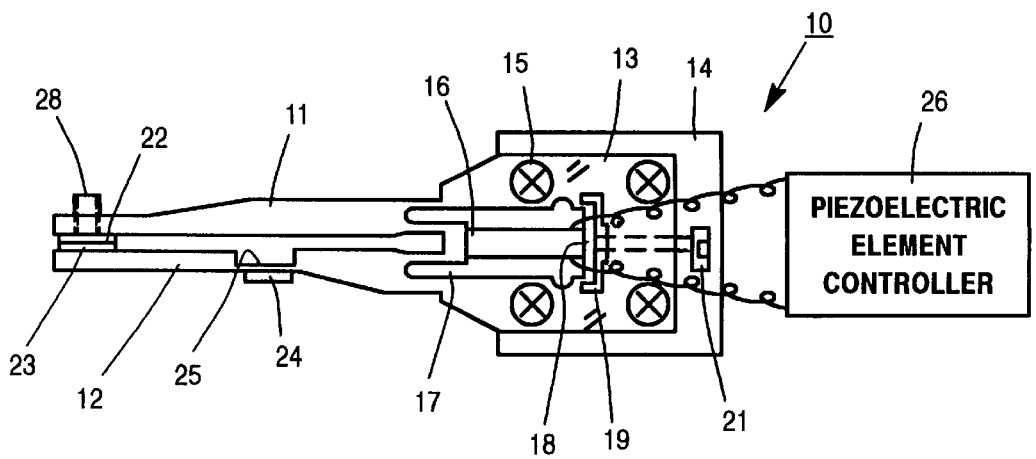
FIG. 1 is a plan view of a prior art low mass piezoelectric actuated wire clamp having normally closed jaws.
Figure 2:
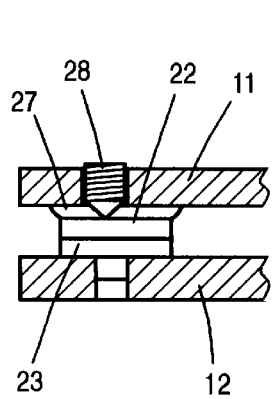
FIG. 2 is an enlarged detail in partial section of the wire clamp jaws shown in FIG. 1.
Figure 3:
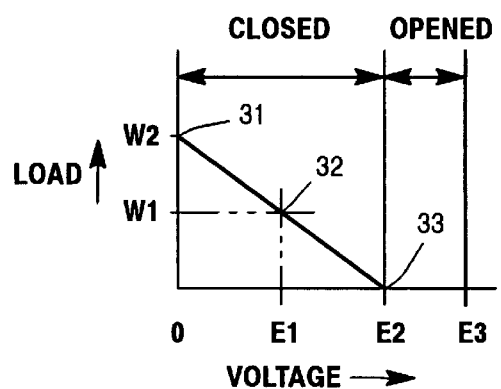
FIG. 3 is a graph showing voltage applied versus clamping load for the prior art wire clamp of FIG. 1.

FIGS. 1 to 3 are abstracted from prior art U.S. Pat. No. 5,388,751. FIG. 1 is a plan view of a prior art low mass piezoelectric actuated wire clamp 10 comprising a pair of symmetrical movable arms 11 and 12 mounted on a main body member 13. The main body member 13 is in turn connected to a support member 14 by screws 15 which are employed to mount the wire clamp 10 on the bonding head of wire bonder (not shown).

A stack of piezoelectric elements 16 are shown mounted in a center aperture 17 of the main body 13. A diaphragm 18 in the main body 13 is made flexible by providing a second apertured slot 19. An adjustment screw 21 is threaded into the body 13 and engages the diaphragm 18 and applies a compression force to the stack of piezoelectric crystals 16 which in turn causes the jaws 22 and 23 of arms 11 and 12 to open. Further, when an electrical voltage is applied to the piezoelectric element 16 the elements expand further opening the jaws 22 and 23. In order to determine the load force being applied to a wire in the normally closed position of the jaws of the desired clamping position, there is a strain gauge 24 mounted on a thin bendable flexible portion 25 of one of the arms 12. The strain gauge 24 is coupled to a controller 26 which is calibrated at the factory.

Refer now to FIG. 2 showing an enlarged detail of the prior art wire clamp jaw 22 mounted on arm 11 by an adhesive 27. The lower jaw 23 is mounted flush on arm 12, however, jaw 23 is spaced apart from arm 11 by a self-centering set screw 28. The adhesive 27 is set with the jaws 22 and 23 in the closed position.

Refer now to FIG. 3 showing a graph of the clamping load versus a voltage applied to the piezoelectric stack 16. It will be noted that the maximum load W2 occurs when no voltage (zero volts) is applied to the actuator 16, thus, the screw 21 used to adjust the compression on the actuator 16 must be backed off to achieve the W2 force at zero voltage. If the actuator 16 is of an improper length, it must be replaced by one which can be compressed to the point where a W2 force is obtained with the jaws closed as determined by the strain gauge 24 and controller 26.

FIG. 3 shows that the application of a voltage from zero up to E2 linearly reduces the clamping force from point 31 to point 32 where the desired clamping force is reached. The jaws open at point 33 until the maximum of the jaws is reached at E3. The clamping force at point 31 may be so great as to deform the wires if zero voltage is applied during normal operating conditions. There is an example given in this prior art patent for the wire clamp 10. It explains that when the load W2 is at about 80 grams the voltage is at zero level. The load diminishes to approximately 40 grams at voltage E1. The E2 voltage is not given but would occur at approximately 100 volts if the curve is linear. E3 is stated to be 100 volts for producing a gap of fifty to seventy microns. The weight of the actuator 16 is explained to be between 0.5 grams and 5.0 grams. The weight of the wire clamp 10 is not explained or given.

Figure 4:
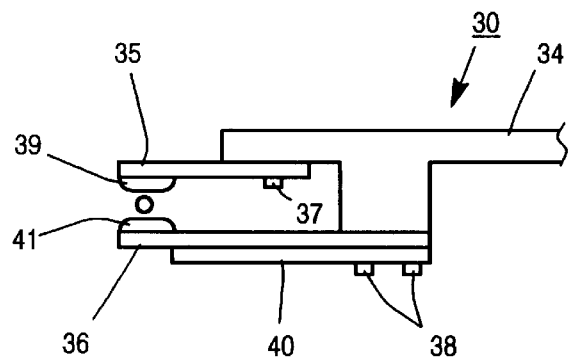
FIG. 4 is a schematic plan view of a prior art low mass bimorph actuated wire clamp having normally open jaws.

Refer now to FIG. 4 which is abstracted from Japanese Patent Application No. 63-284346 and shows a schematic plan view of another prior art wire clamp 30 also showing a pair of arms 35 and 36 mounted by screws 37 and 38, respectively, onto body 34. Screws 38 also holds a bimorph actuator 40 in face-to-face contact with lower arm 36. Permanent jaws 39 and 41 are mounted on the flexible antilever arms 35 and 36, respectively. It will be noted hat the normally open jaws 39 and 41 would not clamp the ire during a fail safe operation. When the power is off, the jaws are open. The clamping forces must be calibrated in the factory and if reset in the field would require special test equipment.

Figure 5:
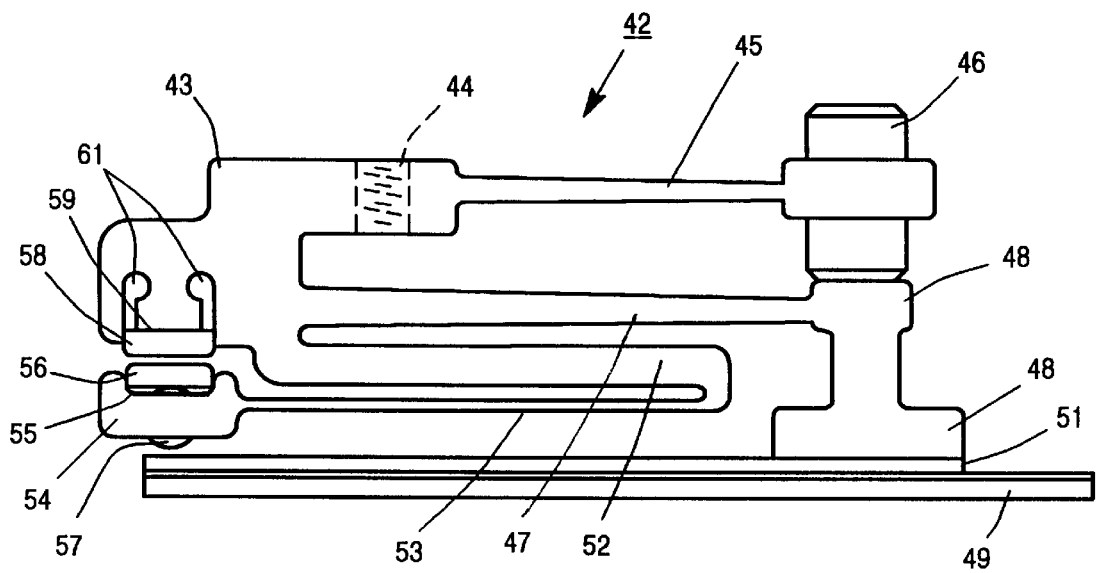
FIG. 5 is an enlarged plan view of a preferred embodiment adjustable wire clamp.

Refer now to FIG. 5 showing an enlarged plan view of the preferred embodiment low mass wire clamp 42 according to the present invention. The overall length of the preferred embodiment wire clamp shown in FIG. 5 is approximately 0.5 inches long and has a total weight less than one gram. The wire clamp 42 comprises a mounting element or body portion 43 which has a mounting screw aperture 44 therein. Extending from the body portion 43 is a cantilevered adjuster arm 45 which carries an adjusting screw 46 therein. The body portion 43 has an extension arm 47 which supports a body extension mount 48 thereon. The body extension mount 48 is designed to support a bimorph actuating element 49 thereon. The bimorph actuator 49 has an accurate alignment edge 51 for aligning with the edge of the body extension mount 48. The free end of the body extension arm 52 is connected to and supports a flexible cantilever arm 53 which terminates at its free end in a movable jaw holder 54 having a movable jaw recess 55 for receiving a movable jaw 56 therein. When cantilever arm 53 is made both flexible as well as bendable, the jaws 56 and 58 will realign if misaligned upon closing. There is shown a spherical ball 57 set in the jaw holder 54 which self-aligns the movable jaw 56 when it engages the fixed jaw 58. In the preferred embodiment of the present invention the fixed jaw recess 59 provides an accurate mounting surface for the fixed jaw 58 which may be attached thereto by a very thin adhesive which does not destroy the accuracy of mounting. When adhesives are used it is preferred that the movable jaw 56 have a self-curing and setting adhesive spaced at the rear of the movable jaw 56 and the movable jaw recess 55. The same spherical ball set in holder 54 provides an accurate point contact surface for engagement by the bimorph actuator 49 when a voltage is applied thereto as will be explained hereinafter. In the preferred embodiment of the present invention there is a highly accurate space provided between the two jaws 56 and 58 due to machining of the total body portion 43 as a unit employing highly accurate EDM machining. When the parts are assembled and the adjusting screw 46 added, it is possible to accurately engage the bimorph actuator with the spherical ball 57 and obtain the proper no load contact between the jaws 56 and 58 under zero voltage conditions. It will be understood that the novel wire clamp 42 is a fail safe wire clamp which does not lose the wire during a power outage.

Figure 6:
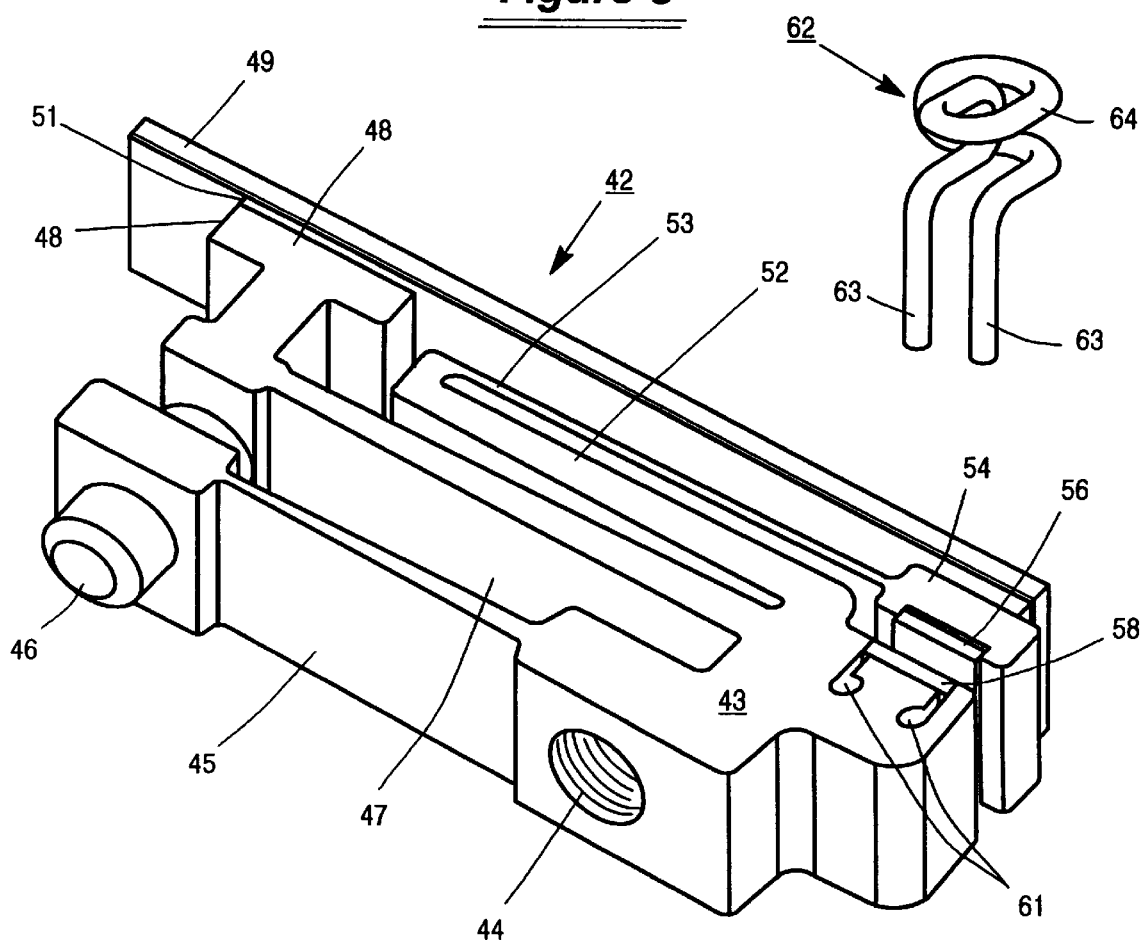
FIG. 6 is a left side isometric view of the wire clamp shown in FIG. 5.

Refer now to FIG. 6 showing a left side isometric view of the preferred embodiment wire clamp shown in FIG. 5. The numbers shown for the wire clamp 42 are identical to those shown in FIG. 5 and their operation is the same and does not require additional explanation. The wire guide apertures 61 are adapted to receive a wire guide 62 made from a single continuous piece of wire. In the preferred embodiment of the present invention the wire guide 62 comprises a pair of vertical free ends 63 which are adapted to fit snugly into the wire guide apertures 61. The wire guide 62 is further provided with a horizontal portion 64 which is preferably made in the form of a "C" or a "G" so as to permit slipping a vertical bonding wire into the wire guide without removing the wire from the jaws 56 and 58. Another advantage to the wire guide 62 is that it may be removed from its receiving apertures and slipped around a wire that is held in the jaws 56 and 58 and the horizontal portion may then be made in the form of a "U". Another advantage to the wire guide 62 is that it can be removed hen cleaning the jaws 56 and 58 and then replaced.

Figure 7:
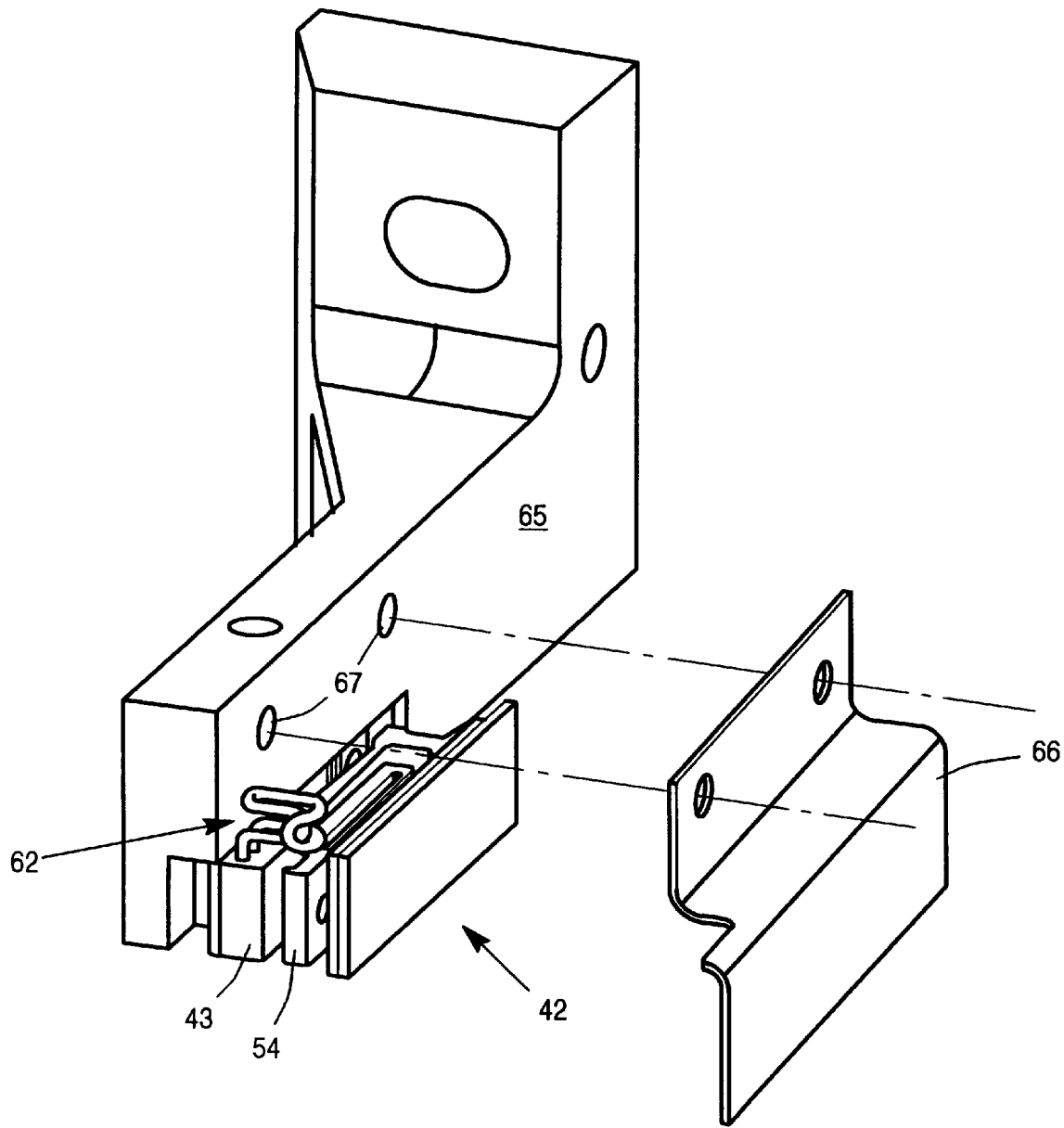
FIG. 7 is a right side isometric view of the wire clamp shown in FIGS. 5 and 6 showing a mounting bracket and a removed electrical cover.

Refer now to FIG. 7 showing a right side isometric view of the wire clamp 42 shown in FIGS. 5 and 6 and showing a mounting bracket 65 adapted to mount the wire clamp 42 to a bonding head (not shown). There is also provided an electrical insulating cover 66 adapted to be mounted to the mounting bracket 65 by threaded holes 67 and cap screws which are not shown. It will be understood that the wire clamp 42 has a threaded hole 44 and an adjustment screw 46 shown in FIGS. 5 and 6 which are accessible through apertures at the rear of the mounting bracket 65 and are not shown in this view. The electrical cover need only be removed for replacement of the wire clamp 42. The jaws 56 and 58 are accessible for cleaning or threading wires and/or making adjustments without removal of the wire clamp cover 66 from the mounting bracket 65.

Figure 8:
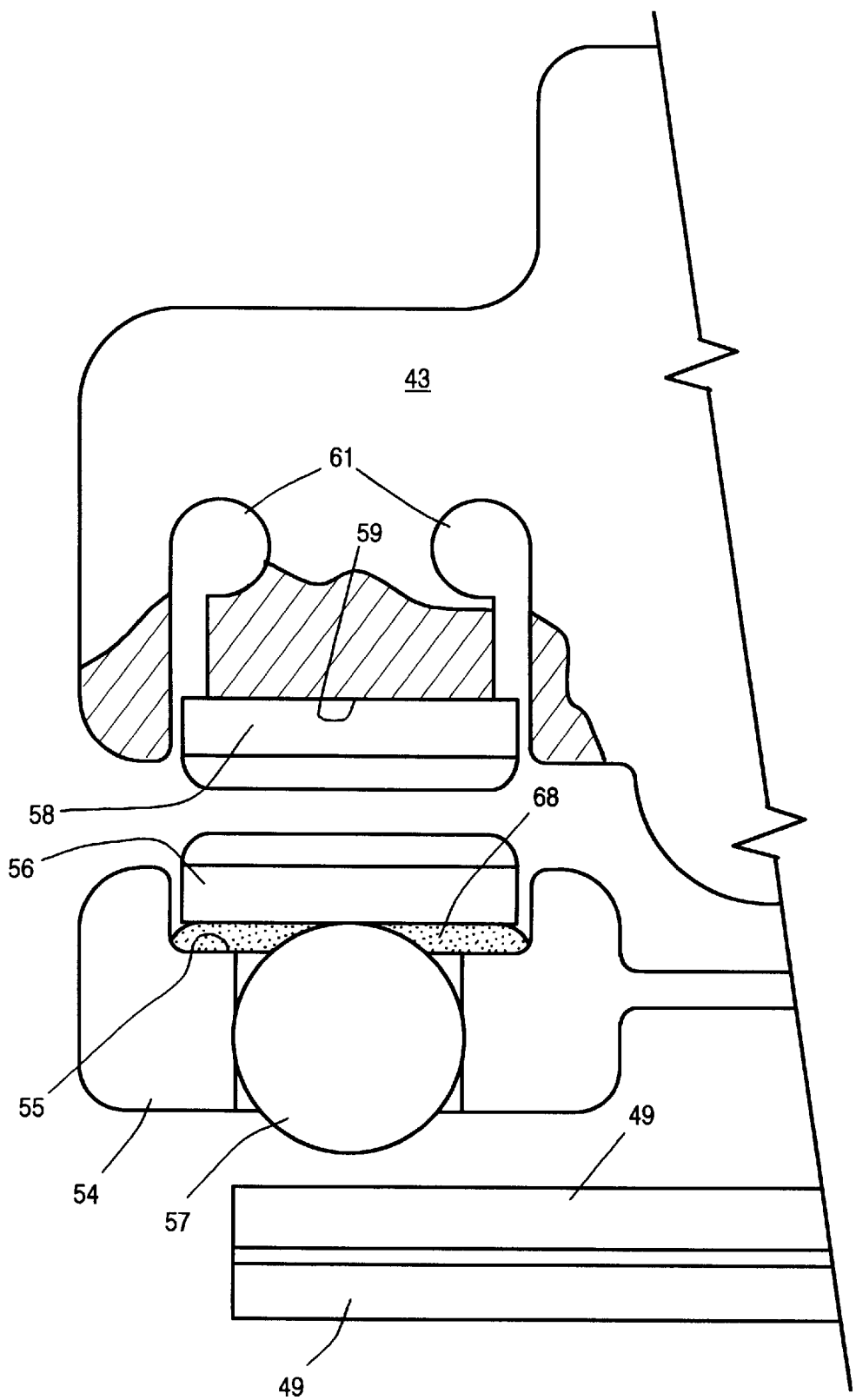
FIG. 8 is an enlarged detail in partial section of the wire clamp jaws shown in FIG. 5.

Refer now to FIG. 8 showing a greatly enlarged detail in partial section of the wire clamp jaws 56 and 58 shown in FIG. 5. The movable jaw 56 is shown attached to the movable jaw holder 54 by an adhesive 68. While it is possible to insert the jaw 56 into a close fitting recess 55 which allows continuous realignment and adjustment in the preferred embodiment, the adhesive 68 may be made rigid or semi-rigid and accomplish perfect alignment with the face of the fixed jaw 58. The fixed jaw 58 is preferably adhesively bonded to the mounting element 43 at the mounting surface 59, but may be crimped and held in place if so desired. It will be noted that the movable jaw holder 54 and the mounting element 43 which has wire guide receiving aperture 61 therein may be continuously cut with a wire EDM machine to accuracies of a few microns so that all of the parts of the wire guide 42 are precisely located relative to each other and do not require further adjustment during manufacturing and assembly which includes inserting the jaws 56 and 58 therein. In the preferred embodiment shown, the jaws 56 and 58 may be made replaceable or may be disposable due to wear without having to throw away the wire guide 42 employing techniques and procedures which are well-known by servicemen in the wire bonding art.

Figure 9:
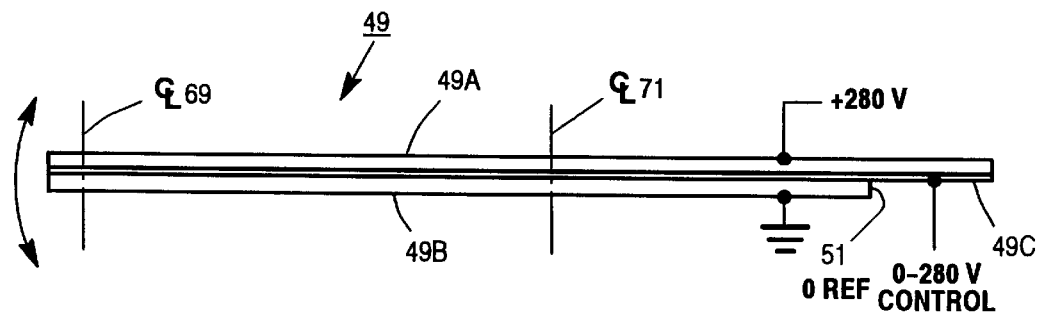
FIG. 9 is an enlarged plan view of the preferred bimorph actuator used in the wire clamps of FIGS. 5 to 8.

Refer now to FIG. 9 showing an enlarged plan view of a preferred embodiment bimorph actuator 49 of the type used in the wire clamps 42 shown in FIGS. 5 to 8. The bimorph actuator 49 is shown comprising an upper active element 49A and a lower active element 49B polarized so that their crystal orientation is aligned in the vertical plane for expansion or contraction as the case may be. The active elements 49A and 49B are permanently attached to a thin conductive center element 49C to complete the three element bimorph 49. In the preferred embodiment shown, a high reference voltage shown as 280 volts is connected to a conductive surface on the upper element 49A and a conductive surface on the lower active element 49B is connected to a ground or reference plane. The center conductive element 49C may comprise a coated layer or a flexible conductive sheet connected to a variable voltage which may range between zero and 280 volts and comprises the control voltage for bending the bimorph 49. It will be understood that adjusters of the type to be described hereinafter may be coupled to the bimorph 49 at the centerlines 69 and 71 so as to adjust the normally closed clamping and force on a wire doing a fail safe or no voltage operation. When a positive voltage is applied to the center conductor 49C a downward force is created to open or close the jaws 56 and 58. The voltages shown are only suggestive and the control voltages may be adjusted from a negative voltage to a positive value so that the wire clamps open widely.

Figure 10:
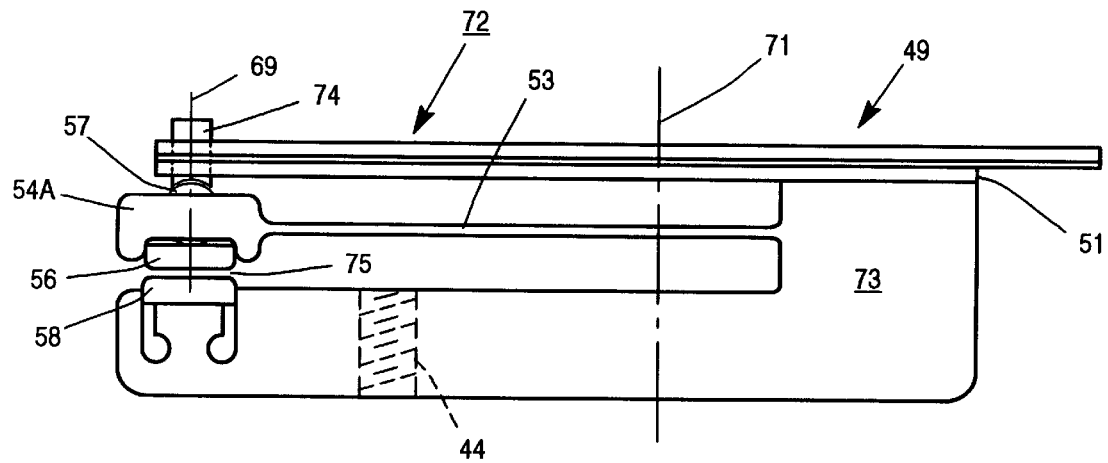
FIG. 10 is a plan view of a modified embodiment wire clamp.

Refer now to FIG. 10 showing a plan view of a modified embodiment wire clamp 72. The FIG. 10 modified embodiment is shown having a body portion 73 having a mounting screw aperture 44 therein and a recess for supporting the fixed jaw 58. Further, the body portion 73 comprises the support for a flexible cantilever arm 53 which supports the movable jaw holder 54A in which the movable jaw 56 is mounted. There is further provided an adjustment set screw 74 mounted through an insulating washer or element in the bimorph actuator 49 which is engagable with the ball 57 so as to make a critical adjustment for the gap 75 between the jaws 56 and 58 during a zero voltage or fail safe condition. It will be noted that the mounting edge 51 of the bimorph 49 is aligned with the edge of the body portion 73 of the wire clamp 72.

Figure 11:
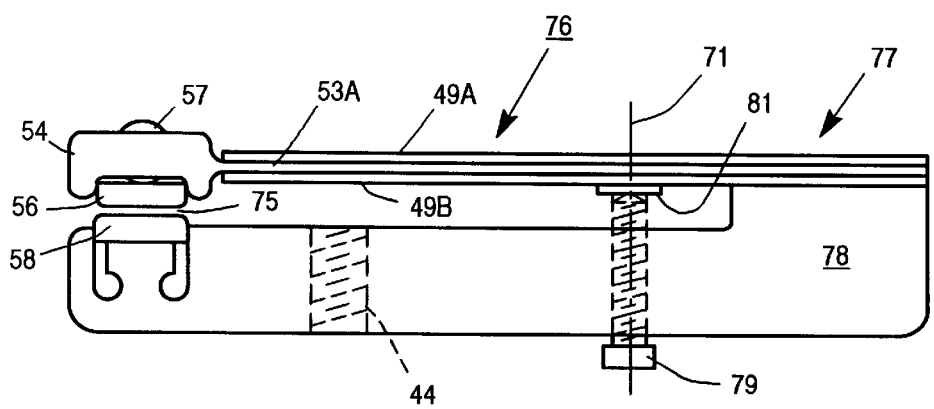
FIG. 11 is a plan view of a modified embodiment bimorph actuator which may be used on modified preferred embodiment wire clamps.

Refer now to FIG. 11 showing a plan view of another modified embodiment wire clamp 76 which comprises a modified embodiment bimorph 77. The bimorph 77 comprises a center flexible cantilever arm 53A with two active elements 49A and 49B as shown. The movable jaw holder 54A which contains the spherical ball 57 and the movable jaw 56 are substantially the same as that shown hereinbefore. In this embodiment the bimorph 77 is attached to a body portion 78 which supports the fixed jaw 58 and provides a mounting screw aperture 44 as explained in FIG. 10. Further there is provided a cap screw 79 threaded through the body portion 78 which contacts and engages an insulating wear pad 81 which is affixed to the lower active element 49B of the bimorph 77. The cap screw 79 could be mounted on bimorph 77 and used to adjust gap 75.

Figure 12:
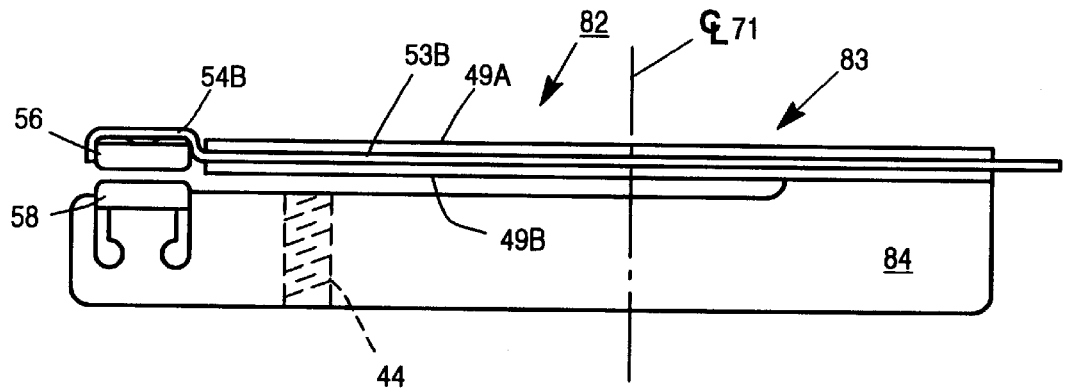
FIG. 12 is a plan view of another modified embodiment bimorph actuator which may be used on modified preferred embodiment wire clamps.

Refer now to FIG. 12 showing yet another modified embodiment wire clamp 82 having a further modified embodiment bimorph actuator 83. In this embodiment the novel bimorph actuator 83 comprises active elements 49A and 49B with a formed center cantilever lever 53B which for the purposes of operation must be made of a formed sheet or thin plate having a jaw holder 54B for receiving and mounting a movable jaw 56. The recess for mounting the jaw 58 in a fixed body portion 84 is the same as that explained hereinbefore and the body portion 84 may be mounted to a mounting bracket 65 by the thread aperture 44. As explained hereinbefore an adjuster may be connected on centerline 71 to adjust the zero voltage fail safe clamping force.

Figure 13:
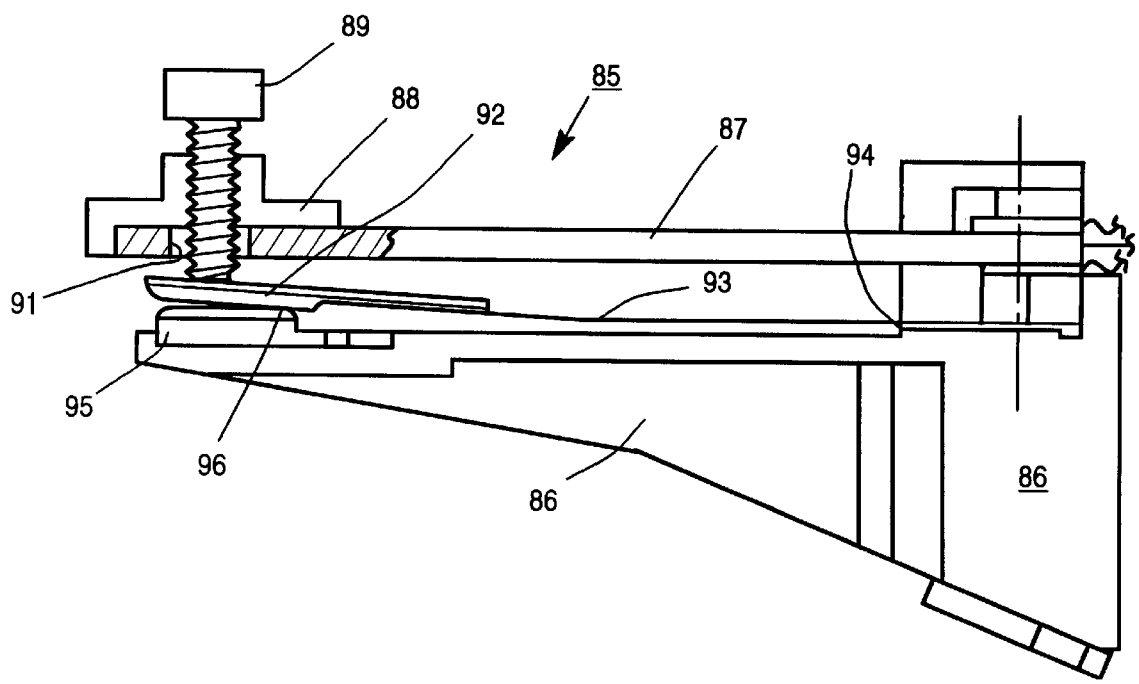
FIG. 13 is a plan view of a high mass prototype wire clamp showing details of a manual adjustment screw used for a bimorph actuator.

Refer now to FIG. 13 showing a plan view of a high mass prototype wire clamp for proving the details of a preferred embodiment manual adjustment screw used with a bimorph actuator. The wire clamp 85 comprises a fixed arm 86 and a movable cantilevered arm 87 which is also a bimorph actuator. The bimorph actuator 87 is shown having an insulating washer 88 attached at the free end of the movable bimorph 87 so as to provide an insulated threaded aperture for the adjustment screw 89 which extends through an aperture 91 in the end of the bimorph 87. The end of the adjusting screw is shown engaging the back surface of a movable jaw 92 which is mounted on a spring 93 that is free to bend as a lever and spring while mounted at point 94 on the fixed arm 86. The movable jaw 92 is adapted to be engagable on a fixed jaw 95 at a line of contact 96 which provides a rocking surface for the movable jaw 92. Locking jaws are known in the prior art and have been explained in our U.S. Pat. No. 5,277,355 assigned to the assignee of the present invention. Thus, it will be understood that the novel adjusting screw 89 may be incorporated into a bimorph actuator 87 if properly isolated from the bimorph which has an active voltage on the active elements and requires electrical isolation in an operable embodiment.

In the preferred embodiment of the present invention, the insulating washers used on the bimorph actuators may be made from any number of insulating plastics such as Delrin™. Further, to assure that an operator does not accidentally touch an electrically activated active element 49A or 49B the whole bimorph actuator with the exception of the mounting and wire connections is coated with a thin layer of Parylene™ or other appropriate insulating material before being assembled to its mounting structure in a wire clamp.

In the preferred embodiments explained hereinbefore, the wire clamps have one movable arm which may be easily adjusted by adjusting screws 69, 79 and 89 mounted to effect the gap 75. However, it will be understood that the present invention principals shown in FIGS. 9 to 13 may be incorporated into more expensive modified embodiment such as one which includes a pair of bimorph actuators and a pair of flexible arms 53 juxtaposed each other and mounted on a body portion 73, 78 or 84 as the case may be Having explained a preferred embodiment wire clamp actuator which employs a low mass and fast acting bimorph actuator, it will be understood that the wire clamps embodying the same structure and mode of operation may be employed in other types of tweezer structures. Further, various forms of low mass actuators have been shown having elements which may be interchanged with the different embodiments so as to produce an ultra low mass wire clamp capable of very high speed clamping operating under very high acceleration and deceleration forces which exceed thirty times the gravitational force (30 g's) without appreciable modification of the clamping force which seldom exceeds or needs to exceed 100 grams. The mass of the jaw 56 and holder 54 may be reduced to tens of milligrams thus reducing accelerating and decelerating forces to about one gram at 30 g's. Further, it will be understood that the bimorph actuator is a substantially stiff structure and only moves a few 10 mils over the extreme ranges of voltages ordinarily applied in the present preferred embodiment wire clamps.

I claim:

1. An ultra low mass wire clamp, comprising:

a mounting element for supporting a fixed position jaw, a cantilevered arm extending from and supported by said mounting element for mounting a movable jaw juxtaposed said fixed position jaw, a bimorph actuator supported on said mounting element, said bimorph actuator comprising a cantilevered beam having one end supported by said mounting element and a free end for applying a point source force at the back of said movable jaw, means for aligning the clamping faces of said jaws one with the other, and means for adjusting the gap between said jaws in a power off mode to a dimension which causes said jaws to engagably clamp a wire therebetween.

2. An ultra low mass wire clamp as set forth in claim 1 wherein said means for adjusting the gap comprise screw means mounted on said body element.

3. An ultra low mass wire clamp as set forth in claim 2 which further includes means for attaching said wire clamp to a bond head.

4. An ultra low mass wire clamp as set forth in claim 1 wherein said mounting element comprises a pair of cantilevered arms.

5. An ultra low mass wire clamp as set forth in claim 1 wherein said means for aligning the clamping faces of said jaws comprises a ball shaped element.

6. An ultra low mass wire clamp as set forth in claim 5 wherein said ball shaped element is mounted on the cantilevered arm having the movable jaw and comprises a means for aligning the clamping faces of said jaws.

7. An ultra low mass wire clamp as set forth in claim 5 wherein said ball shaped element is mounted on the bimorph actuator.

8. An ultra low mass wire clamp as set forth in claim 1 wherein the means for adjusting the gap between said jaws comprises an adjusting screw coupled between said bimorph actuator and said mounting element.

9. An ultra low mass wire clamp as set forth in claim 8 wherein said adjusting screw is mounted on an arm extending from said mounting element.

10. An ultra low mass wire clamp as set forth in claim 1 wherein the means for adjusting the gap between said jaws comprises an adjusting screw coupled between said bimorph actuator and said cantilevered arm.

11. An ultra low mass wire clamp as set forth in claim 1 which further includes means for attaching said bimorph actuator on to said wire clamp body portion so that the free end of said actuator is precisely positioned juxtaposed a point on said recess on said cantilevered arm.

12. An ultra low mass wire clamp as set forth in claim 1 which has a length less than one inch and a mass less than one ounce.

13. An ultra low mass wire clamp as set forth in claim 12 wherein the mass of said wire clamp is less than five ounces and acceleration forces on said jaws are negligible.

14. An ultra low mass wire clamp as set forth in claim 1 wherein said wire clamp further includes a bonding wire guide mounted in a pair of mounting holes located in said wire clamp mounting element.

15. An ultra low mass wire clamp as set forth in claim 12 wherein said bimorph actuator comprises two layers of piezoelectric material sandwiched onto a central flexible conductive layer, and one of said piezoelectric layers being shorter than the other having a precise edge mounting surface for mounting in alignment with an edge mounting surface on said body portion.

16. An ultra low mass wire clamp as set forth in claim 11 wherein said wire clamp further comprises a bonding wire guide inserted in a pair of mounting holes located in said wire clamp body portion.

17. An ultra low mass wire clamp as set forth in claim 16 wherein said bonding wire guide comprises a continuous length of wire bent into two orthogonal planes and having vertical legs inserted into said mounting holes.

18. An ultra low mass wire clamp, comprising:

a wire clamp body portion, a first and a second cantilevered arm extending from said body portion having machined recesses therein for mounting a first and a second hard jaw in an exact position in which the faces of the jaws are parallel, means on at least one of said cantilevered arms in said machined recess for exerting a point force on the back of a hard jaw for orienting the faces of the jaws in the same plane, and bimorph actuator means mounted on said wire clamp body portion, said wire clamp body portion and said cantilevered arms being wire EDM machined from a single block of high strength material so that said recesses and said means for supporting an actuator are precisely located relative to each other, and means for adjusting the gap between said jaws to a normally closed fail safe position.

* * * * *